(12) United States Patent
Jurasek et al.

(10) Patent No.: US 7,944,300 B2
(45) Date of Patent: May 17, 2011

(54) BIAS CIRCUIT AND AMPLIFIER PROVIDING CONSTANT OUTPUT CURRENT FOR A RANGE OF COMMON MODE INPUTS

(75) Inventors: Ryan Jurasek, Boise, ID (US); Aaron Willey, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 45 days.

(21) Appl. No.: 12/547,338

(22) Filed: Aug. 25, 2009

(65) Prior Publication Data

US 2011/0050343 A1    Mar. 3, 2011

(51) Int. Cl.
*H03F 3/45* (2006.01)
(52) U.S. Cl. .......................... 330/261; 330/296
(58) Field of Classification Search .................. 330/261, 330/285, 296
See application file for complete search history.

(56) References Cited

U.S. PATENT DOCUMENTS

| | | | |
|---|---|---|---|
| 7,209,006 B1 * | 4/2007 | Mohan | 330/259 |
| 7,375,585 B2 | 5/2008 | Trifonov et al. | 330/258 |
| 7,522,003 B2 * | 4/2009 | Seth et al. | 330/296 |
| 7,737,782 B1 * | 6/2010 | Sudou | 330/253 |

* cited by examiner

*Primary Examiner* — Henry K Choe
(74) *Attorney, Agent, or Firm* — Dorsey & Whitney LLP

(57) ABSTRACT

Bias circuits, amplifiers and methods are provided, such as those for providing bias signals over a range of common mode inputs for an amplifier to output a constant current. One example of a bias circuit is configured to generate a bias signal having a voltage magnitude according to a reference signal. The reference signal is indicative of a common mode input level of an input signal of the amplifier circuit and the bias circuit is further configured to adjust the bias signal over a range of common mode input levels. An amplifier receiving the bias signal is configured to generate an output signal in response to an input signal and drive an output current based on the voltage magnitude of the bias signal provided by the bias circuit.

27 Claims, 9 Drawing Sheets

BIAS CIRCUIT AND AMPLIFIER PROVIDING CONSTANT OUTPUT CURRENT FOR A RANGE OF COMMON MODE INPUTS

TECHNICAL FIELD

Embodiments of the invention relate generally to amplifier circuits, and more particularly, bias circuits generating bias signals for differential amplifiers for outputting a constant current over a common mode input range.

BACKGROUND OF THE INVENTION

Amplifier circuits generate output signals in response to receiving an input signal. An example of an amplifier circuit is a differential amplifier circuit which receives two inputs and generates one (or two) output signals in response. Typically, the output is based on a difference between the two input signals. A characteristic of differential amplifier circuits is its operability over a range of common mode input voltages, that is, the range of voltages for the portion of the two input signals that are equal (common). Amplifier operation over a wide range of common mode inputs is desirable. For example, a differential amplifier circuit can be used as an input buffer to buffer input signals to be used in other circuitry. Operability over a wide common mode input range allows for the input buffer to buffer input signals of different magnitudes.

A difficulty in operating over a wide range of common mode input voltages, however, is the effect changes in input signal magnitude have on the output signal(s) of the differential amplifier. As known, characteristics of the output signal may be different depending on whether the input signals are in the bottom of the common mode input range or in the upper part of the range, such as having different output current and different output voltage swing in one part of the range compared to another. For example, one approach that has been taken to improve amplifier performance over a range of common mode inputs is to selectively activate n-channel and p-channel stages of a differential amplifier depending on the common mode input level. In the upper range of common mode inputs the n-channel amplifier stage operates whereas in the lower range of common mode inputs the p-channel amplifier stage operates. However, where the common mode input level is such that both the n-channel and p-channel stages are operating, the resulting output current may be twice as much as in the case where only one of the amplifier stages is operating. The increased current when operating in this part of the common mode input range results in an output signal having a swing voltage that may be twice that compared to when the input is at the upper or lower range of common mode inputs. The variability of output current over a range of common mode inputs can reduce timing margin, degrade slew rate, increase power consumption, and increase susceptibility to errors resulting from noise.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
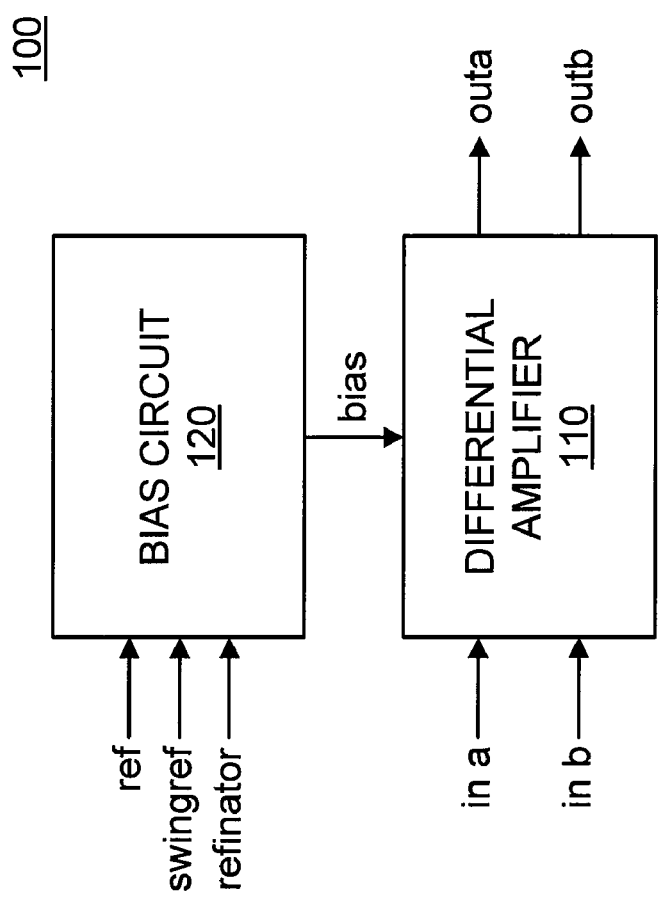
FIG. 1 is a block diagram of an amplifier circuit according to an embodiment of the invention.

FIG. 1 illustrates an amplifier circuit 100 according to an example of the invention. The amplifier circuit 100 includes a differential amplifier 110 and a bias circuit 120. The differential amplifier 110 is configured to receive differential input signals ina, inb, and in response, generate differential output signals outa, outb. The bias circuit 120 is coupled to the differential amplifier 110 and provides a bias signal BIAS for operation of the differential amplifier 110. The BIAS signal may include a single signal, and may include a plurality of signals provided to the differential amplifier 110. The bias circuit 120 receives reference signals ref, swingref, and refinator. The ref signal is used to set a reference level against which the ina, inb signals are compared for generating the outa, outb signals, and generally indicates the common mode input level for the differential amplifier 120. For example, where the voltage of the ina signal is greater than (and the inb signal is less than) a voltage reference level set by the ref signal, the differential amplifier 110 generates an outa signal having a voltage representing a first logic level (e.g., a HIGH logic level) and generates an outb signal having a voltage representing a second logic level (e.g., a LOW logic level) that is complementary of the first logic level. The swingref signal is used to set an output swing voltage for the outa, outb signals. The refinator signal sets a voltage level to saturate transistors of the bias circuit 120, as will be explained in more detail below.

In operation, the bias circuit 120 generates a BIAS signal for the differential amplifier 110 so that the output signals outa, outb have a constant current throughout the common mode input range of the differential amplifier 110.

Figure 2:
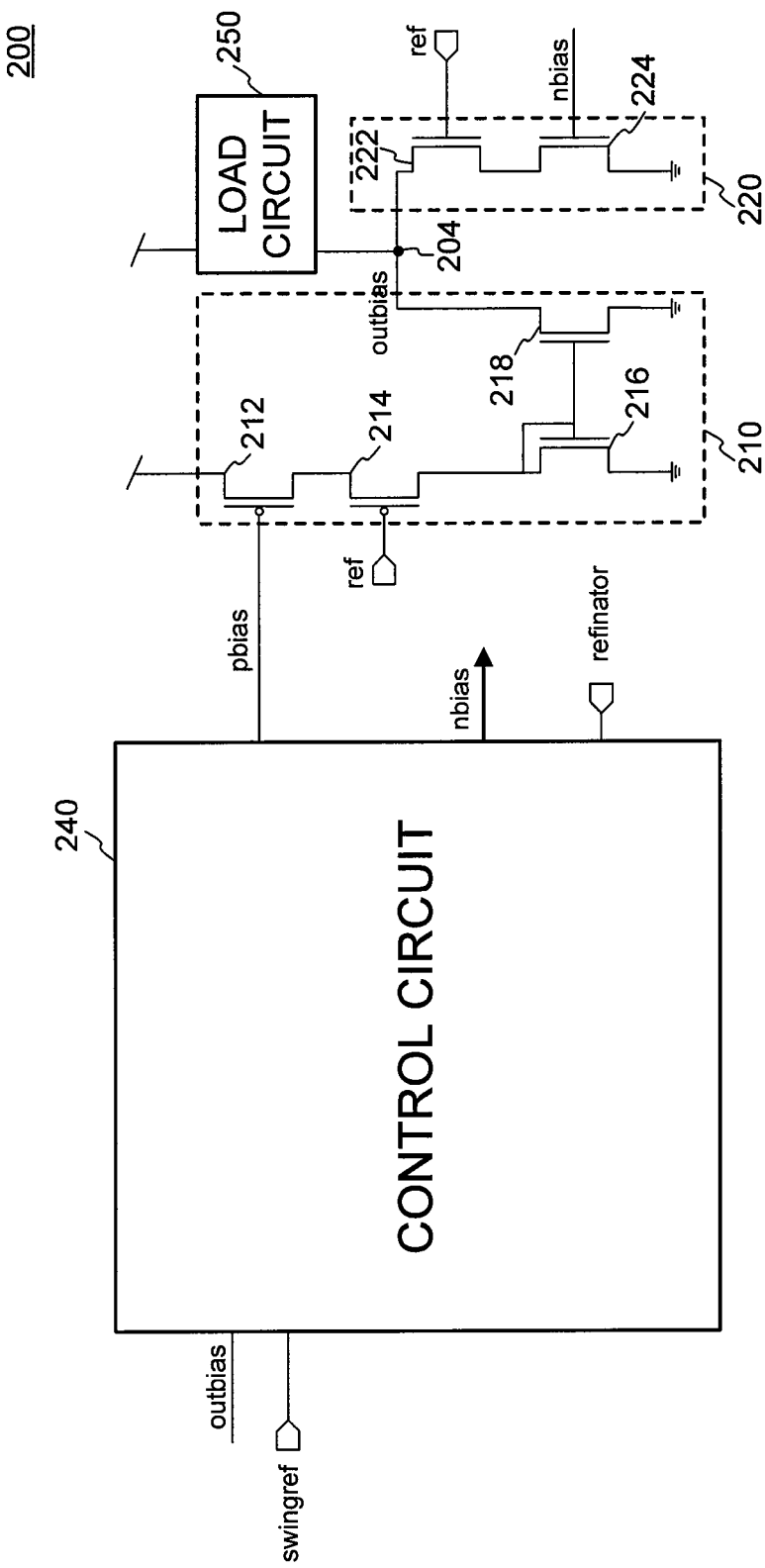
FIG. 2 is a schematic diagram of a bias circuit according to an embodiment of the invention.

FIG. 2 illustrates a bias circuit 200 according to an example of the invention. In an embodiment of the invention, the bias circuit 120 (FIG. 1) is implemented using the bias circuit 200. The bias circuit 200 includes current sources 210, 220 coupled to a load circuit 250. The load circuit 250 may be implemented using conventional load circuits, for example, a resistor, active load circuits, or combinations thereof. The current sources 210, 220 provide current to the load circuit 250 based on reference signal ref and control signals from control circuit 240. Reference signals swingref and refinator may be provided to the bias circuit 200 as well. The load circuit 250 models a load that is driven by the output of a differential amplifier, for example, differential amplifier 110 (FIG. 1), to which the bias circuit 200 provides a bias signal. The ref, swingref, and refinator signals have been previously described with reference to FIG. 1. As will be explained in more detail below, the bias circuit generates pbias and nbias to control the current sources 210, 220 to provide a constant current to the load circuit 250 based on the common mode level (as indicated by the ref signal). The pbias and nbias signals may also be used as the BIAS signal to bias the differential amplifier 110.

The current source 210 includes transistors 212, 214 coupled to a current mirror having transistors 216, 218. Current through the transistors 212, 214 are controlled by the ref signal, and the pbias signal generated by the control circuit 240. The current source 220 includes transistors 222, 224. The current through the transistors 222, 224 are controlled by the ref signal, and the nbias signal generated by the control circuit 240. Although the current sources 210, 220 have been described with reference to FIG. 2 as having particular designs, other designs for current sources 210, 220 may be used in other embodiments as well.

Figure 3:
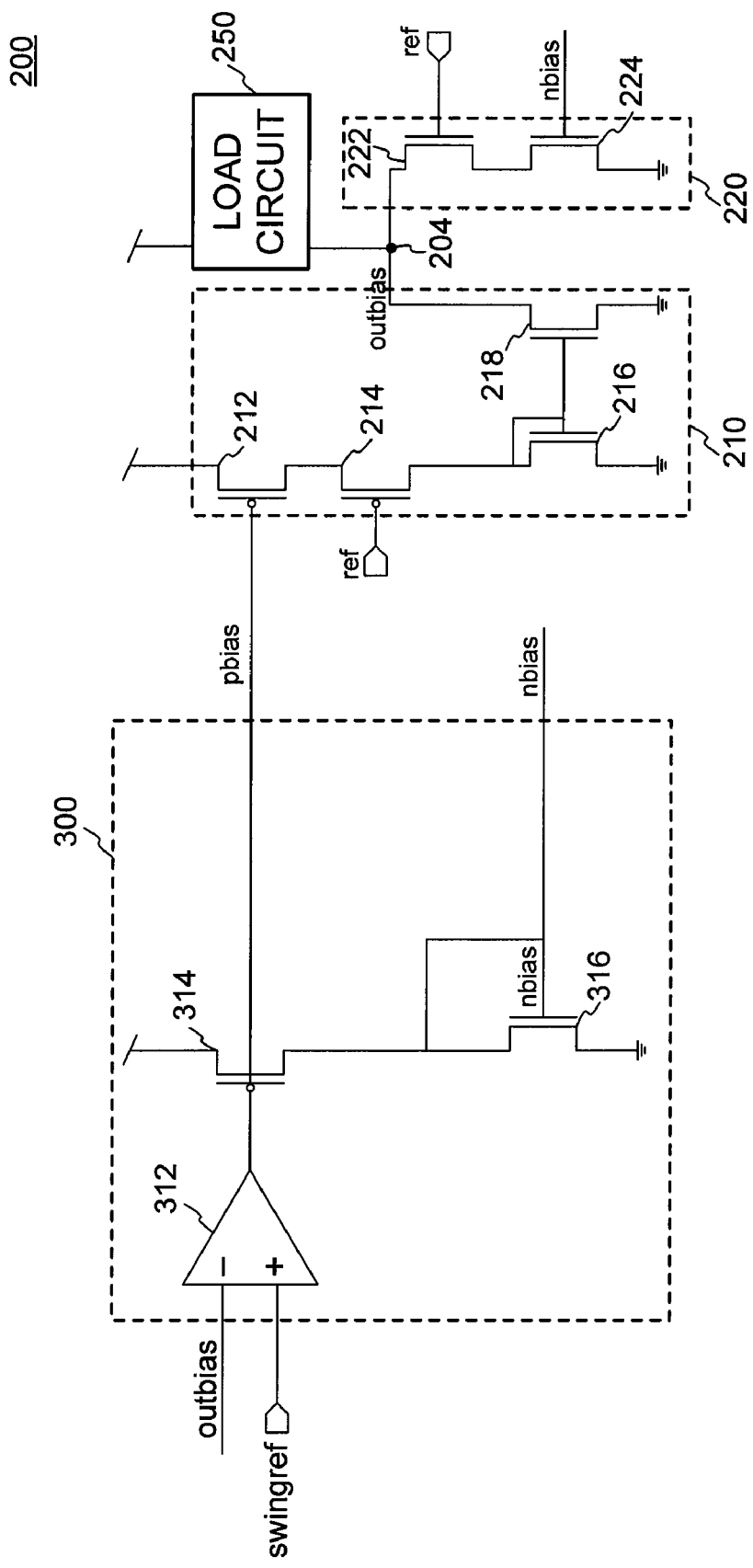
FIG. 3 is a schematic diagram of a bias circuit having a control circuit according to an embodiment of the invention.

FIG. 3 illustrates a bias circuit 200 having a control circuit 300 according to an embodiment of the invention. The control circuit 300 includes a differential amplifier 312 and transistor 314. In some embodiments, the differential amplifier 312 is an operational amplifier. The control circuit 300 generates a control signal pbias according to a comparison of an output bias voltage outbias and the swingref signal. The pbias signal is provided to the current source 210 as well as to the transistor 314. The control circuit further includes a transistor 316. The transistor 316 may be matched to, that is, have similar transistor characteristics as, the transistor 224 of the current source 220. A control signal nbias is provided by the gate voltage of the transistor 316.

In operation, the ref signal is provided to the bias circuit 200 to set a common mode input level. The bias circuit 200 generates control signals pbias, nbias that can be used as BIAS signals to a differential amplifier to provide constant current over a common mode input range. As previously discussed, the ref signal generally indicates the common mode input level for a differential amplifier receiving the bias signal generated by the bias circuit 200. Three examples will be described to illustrate operation of the bias circuit 200 over a range of common mode input levels. The first example is for a relatively low ref signal, a second example is for a relatively high ref signal, and a third example is for a ref signal generally in the middle of the range of common mode input levels.

Where ref is relatively low (e.g., at a lower end of the range of common mode input), a source-drain voltage across the transistor 224 will decrease and result in the transistor 224 becoming less conductive. As the conductivity of the transistor 224 decreases, current through the transistors 222, 224 will decrease and voltage at the node 204, outbias, will increase relative to the swingref signal, causing the control circuit 240 to generate a lower voltage pbias signal. The lower voltage pbias signal will increase the conductivity of the transistor 314 thereby causing the gate voltage of transistor 316 to increase, thereby providing a higher voltage nbias signal. Additionally, the transistor 212 will become more conductive in response to the lower voltage pbias signal and current will increase through the transistors 212, 214, and 216. The increased current through the transistor 216 will be mirrored by increasing current through the transistor 218. As a result, as the current from the current source 220 decreases due to a relatively low ref signal, the current from the current source 210 increases to offset the decrease. The resulting total current through the load circuit 250 (i.e., the total current to the node 204), however, will remain relatively constant.

In contrast, where ref is relatively high (e.g., at the higher end of the range of common mode input), the conductivity of the transistor 214 decreases, causing the transistor 212 to no longer be saturated and the current through the transistors 212, 214 decreases. The reduced current is mirrored by transistors 216, 218 at the node 204, which causes outbias to increase. The increasing outbias voltage is detected by the control circuit 240 and results in an increase in the pbias voltage, causing the transistor 314 to become more conductive. In response, the gate voltage of transistor 316 increases, resulting in a higher nbias voltage which adjusts the current source 220 to increase current to the load circuit 250. As a result, as the current from the current source 210 decreases, the current from the current source 220 increases to offset the decrease. The resulting total current through the load circuit 250 (i.e., the total current to the node 204), however, will remain substantially constant.

Where the ref signal is generally in the middle of the range of common mode inputs, and the transistors 212 and 224 are operating in a saturation region (as well as the transistors 316 and 314 of the control circuit 240), the resulting pbias and nbias signals are such that the current provided by the current source 210 and the current provided by the current source 220 are generally equal.

In summary, the pbias and nbias signals generated by the control circuit 300 over a range of common mode input (as represented by the ref signal) are such that current through the load circuit 250 is relatively constant over the range. In the middle of the common mode input range, the pbias and nbias signals result in generally equal contribution of current to the load circuit 250. In the lower part of the common mode input range, the pbias and nbias signals are adjusted so that current from the current source 210 increases and the current from the current source 220 decreases to provide a total current that is similar to the current in the middle of the common mode input range. In the higher part of the common mode input range, the pbias and nbias signals are adjusted so that current from the current source 210 decreases and the current from the current source 220 increases to a provide a total current that is nearly equal to the current in the middle of the common mode input range. The current transition from common mode high to mid to low may be modified by changing the device characteristics of transistor 214 of the current source 210 and transistor 222 of the current source 220.

The pbias and nbias signals generated by the bias circuit 300 can be provided as bias signals to a differential amplifier (e.g., differential amplifier 110 of FIG. 1) so that the output current of the differential amplifier can remain relatively constant as well.

Figure 4:
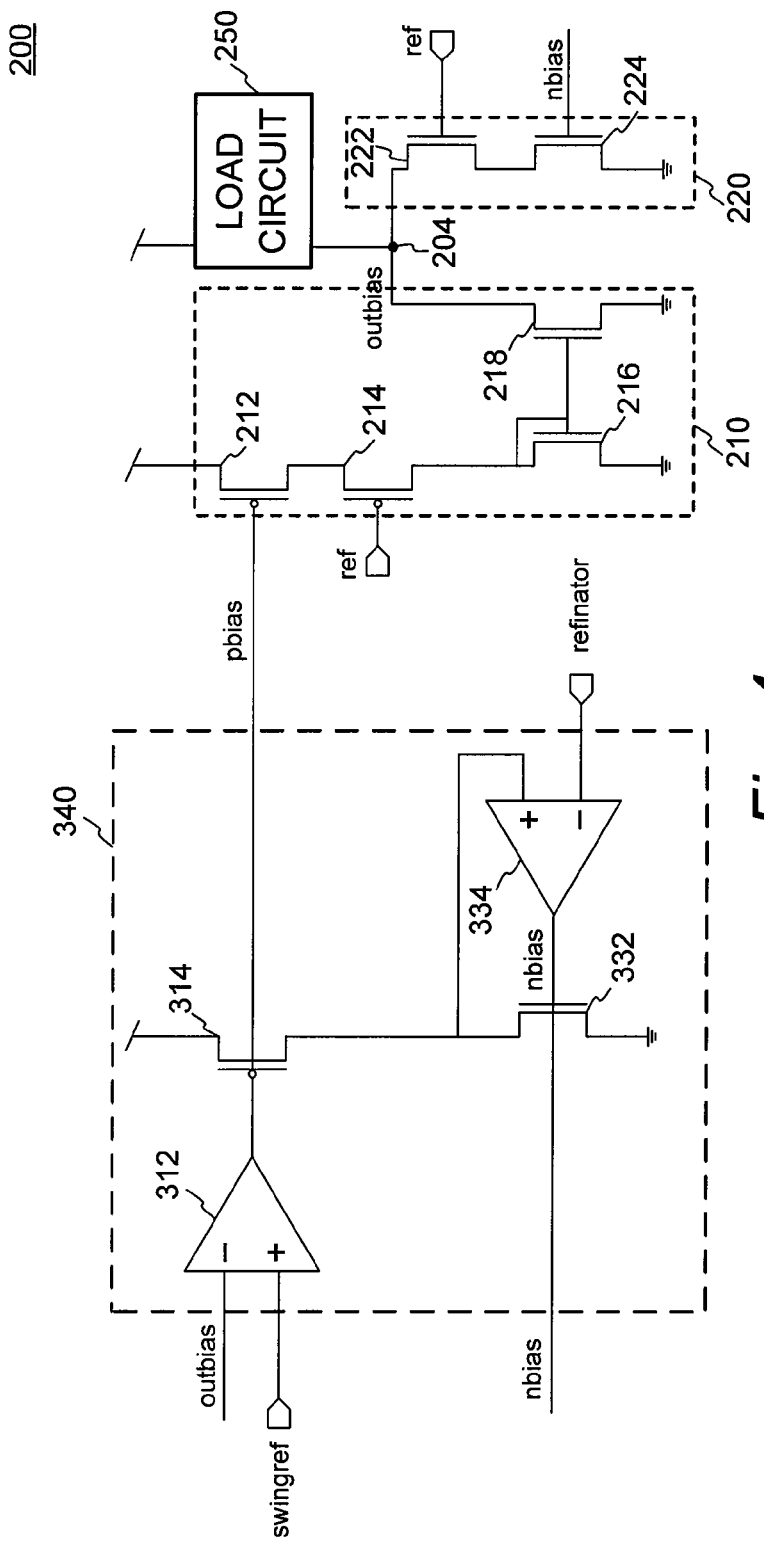
FIG. 4 is a schematic diagram of a bias circuit having a control circuit according to an embodiment of the invention.

FIG. 4 illustrates a bias circuit 200 including a control circuit 340 according to an embodiment of the invention. The control circuit 340 includes differential amplifier 312 and transistor 314 as previously discussed with reference to FIG. 3. The control circuit 340 further includes a differential amplifier 334 and transistor 332. A control signal nbias for adjusting the current through the current source 220 is provided by the gate voltage of the transistor 332. The nbias voltage is based on a comparison of the refinator signal and a voltage at a drain of the transistor 314. Operation of the control circuit 340 is similar to that of the control circuit 300 (FIG. 3) previously described.

Where ref is relatively low, the control circuit 340 will generate a lower voltage pbias signal as previously discussed with the control circuit 300 of FIG. 3. The lower voltage pbias signal will increase the conductivity of the transistor 314 thereby causing the differential amplifier 334 to generate a higher voltage nbias signal at the gate of the transistor 332 as the input to the differential amplifier 334 increases relative to the refinator signal. As a result, as the current from the current source 220 decreases due to a relatively low ref signal, the current from the current source 210 increases to offset the decrease. Where ref is relatively high, as previously discussed, the current provided by the current source 210 decreases, which is detected by the control circuit 340 and results in a decrease in the pbias voltage, causing the transistor 314 to become more conductive. In response, the differential amplifier 334 generates a higher gate voltage for the transistor 332, resulting in a higher nbias voltage which adjusts the current source 220 to increase current to the load circuit 250 to offset the decrease in the current source 210. Where the ref signal is generally in the middle of the range of common mode inputs, the transistors 314 and 332 are operating in the saturation region, resulting in pbias and nbias signals that adjust the current sources 210 and 220 to provide equal current to the load circuit 250.

Figure 5:
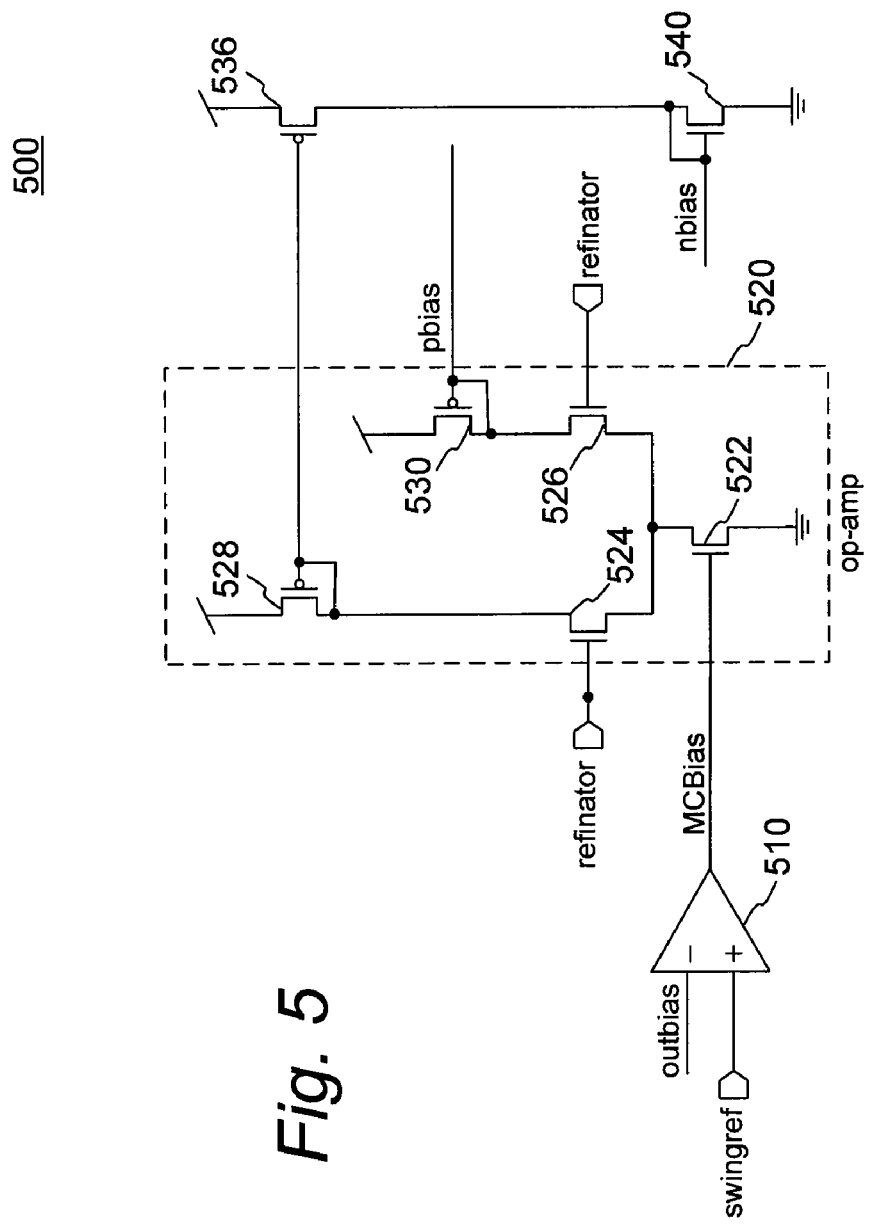
FIG. 5 is a schematic diagram of a control circuit for a bias circuit according to an embodiment of the invention.

FIG. 5 illustrates a control circuit 500 according to an embodiment of the invention. The control circuit 500 includes a differential amplifier 510 coupled to receive the outbias and swingref signals. The output voltage MCBias generated by the differential amplifier 510 is provided to an operational amplifier 520. In particular, the MCBias signal is applied to a gate of transistor 522 to modulate op-amp current based on the outbias and SwingRef signals. The refinator signal is applied to gates of transistors 524, 526, which are coupled to transistors 528, 530, respectively. The gate voltage of the transistor 530 provides the pbias signal. The gate voltage of transistor 528 is applied to a bias generator circuit, in particular transistor 536, which sets up a current condition for transistor 540. The resulting gate voltage of the transistor 540 provides the nbias signal.

In operation, at a low input common mode (i.e., the ref signal is low) the current through current source 220 will decrease and thus the voltage of outbias will increase in reference to SwingRef. In response, the differential amplifier 510 increases the voltage of MCBias causing the current through the op-amp 520 to increase. The voltage of the pbias signal decreases and the voltage of the nbias signal increases as a result. The change in the pbias and nbias signals cause the current from the current source 220 to decreases, with the current from the current source 210 increases to offset the decrease of current from current source 220. In effect, the current through the current source 210 will increase and remain saturated and pull down the voltage of outbias to be equal with SwingRef. For a high input common mode, the pbias and nbias signals generated by the control circuit 500 decreases and increases, respectively, to decrease the current from the current source 210 while increasing the current from the current source 220 to offset the decrease of current from the current source 210. For a middle input common mode, the pbias and nbias signals generated by the control circuit 500 adjust the current sources 210 and 220 to provide equal current to the load circuit 250.

Figures 6A, 6B:
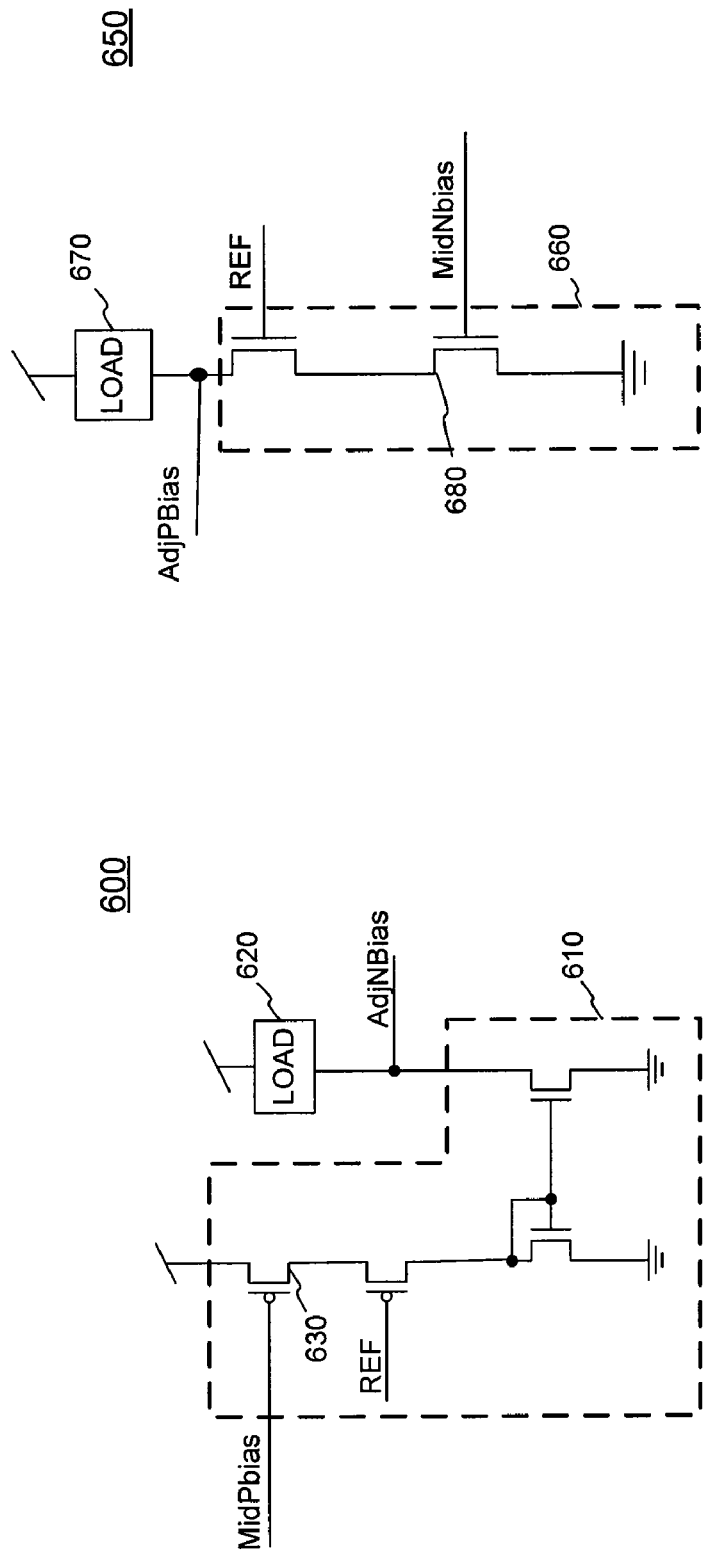
FIG. 6A is a schematic diagram of a control bias circuit according to embodiment of the invention.
FIG. 6B is a schematic diagram of a control bias circuit according to embodiment of the invention.

In an alternative embodiment, the refinator signals applied to transistors 524, 526 of the op-amp 520 are substituted with signals AdjNBias applied to the transistor 524 and AdjPBias applied to the transistor 526. The AdjNBias and AdjPBias signals are used to set the conductivity of the transistors 524, 526. FIG. 6A illustrates a control bias circuit 600 according to an embodiment of the invention for generating the AdjNBias signal. The control bias circuit 600 includes an adjustable current source 610 coupled to a load circuit 620. The adjustable current source 610 models the current source to be controlled by the pbias signal generated by the control circuit 500. For example, where the pbias signal is used to adjust the current of the current source 210 (FIG. 2), the adjustable current source 610 is the same as the current source 210. The load circuit 620 is equal to the load circuit 670 to which the current source controlled by MidNbias signal provides current. For example, assuming the load circuit 670 is to be provided current, the load circuit 620 is equal to the load of the load circuit 670. A MidPbias signal is applied to a transistor 630 of the adjustable current source 610 to adjust the current provided to the load circuit 620.

FIG. 6B illustrates a control bias circuit 650 according to an embodiment of the invention for generating the AdjPBias signal. The control bias circuit 650 includes an adjustable current source 660 coupled to a load circuit 670. The adjustable current source 660 models the current source to be controlled by the nbias signal generated by the control circuit 500. For example, where the nbias signal is used to adjust the current of the current source 220 (FIG. 2), the adjustable current source 660 is the same as the current source 220. The load circuit 670 is equal to the load circuit 620 to which the current source controlled by MidPbias signal provides current. For example, assuming the load circuit 620 is to be provided current, the load circuit 670 is equal to the load of load circuit 620. A MidNbias signal is applied to a transistor 680 of the adjustable current source 620 to adjust the current provided to the load circuit 670.

The embodiment of the control circuit 500 in which AdjNBias and AdjPBias signals are provided to the op-amp 520 may be used to accelerate changes in current for current sources 210 and 220. The MidPbias and MidNbias signals applied to transistors 630 (FIG. 6A) and 680 (FIG. 6B) are current biases that allow one-half the total current to be delivered by current sources 610 and 660, respectively. The ref signal is used as a control input. In operation, transistors 630 or 680 are in a linear region of operation, the AdjPBias or AdjNbias signals increase to actively introduce current to the current source 210 or the current source 220, and remove current in the opposite current source.

Figure 7:
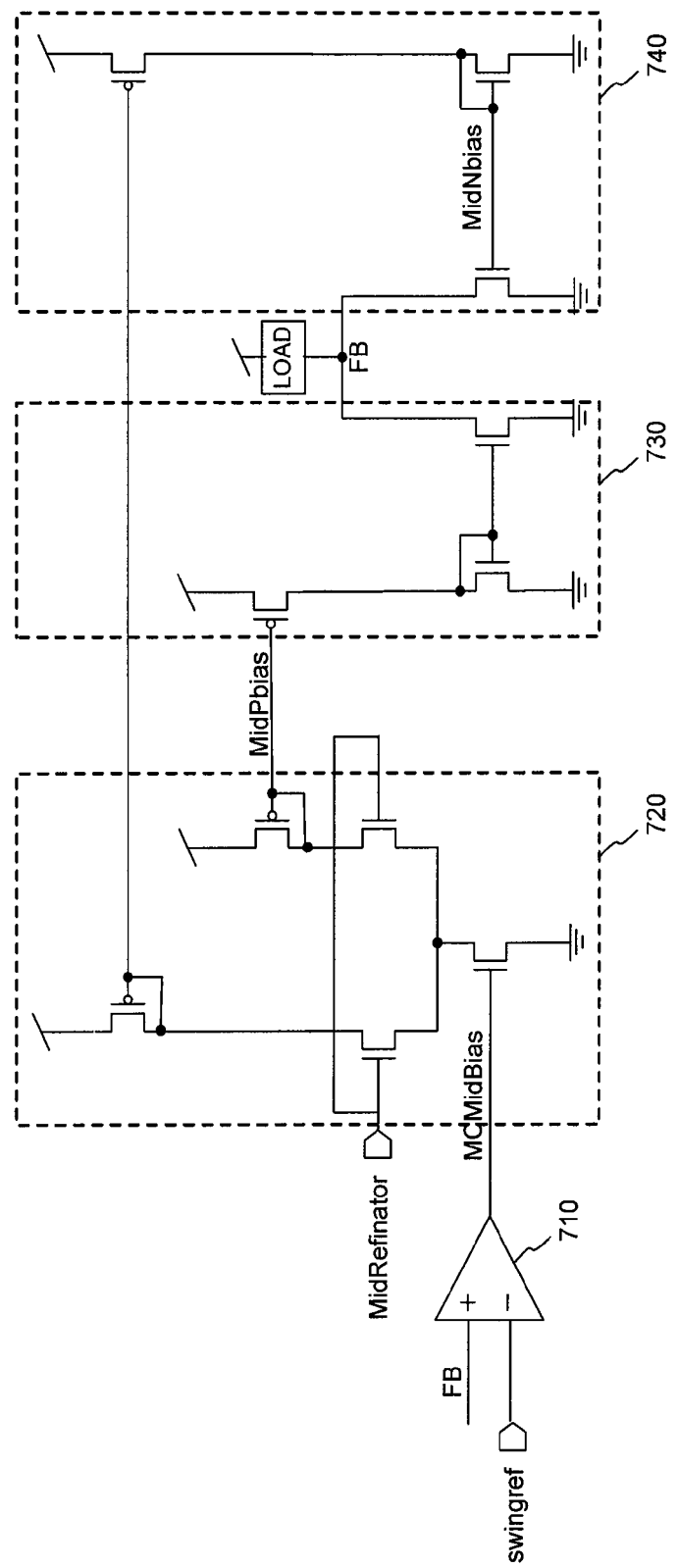
FIG. 7 is a schematic diagram of a control bias circuit according to an embodiment of the invention.

FIG. 7 illustrates a control bias circuit 700 for generating MidPbias and

MidNbias signals that may be used with the control bias circuits 600 (FIG. 6A) and 650 (FIG. 6B). The control bias circuit 700 includes a differential amplifier 710 that provides a bias signal MCMidBias to an operational amplifier 720. The voltage of the bias signals MCMidBias is based on a feedback voltage FB and the Swingref signal. A MidRefinator signal is applied to the op-amp 720 to set a voltage level to saturate transistors of the op-amp 720. Current sources 730 and 740 are coupled to the op-amp 720 and further coupled to a load circuit 750, which models the load to which current is provided by current sources adjusted by the pbias and nbias signals, for example, the load circuit 250 (FIG. 2). The current sources 730, 740 provide current to the load circuit 750 (node FB) based on bias signals generated by the op-amp 720. The current source 730 is controlled by the MidPbias signal, and the current source 740 is controlled by a bias signal from which the MidNbias signal is derived. The MidPbias and MidNbias signals generated by the control bias circuit 700 may be used to set current sources coupled to a load circuit and adjusted by pbias and nbias to provide equal current to the load circuit without influence by the ref signal. That is, the MidPbias and MidNbias signals do not change with changes to the common mode setting.

Figure 8:
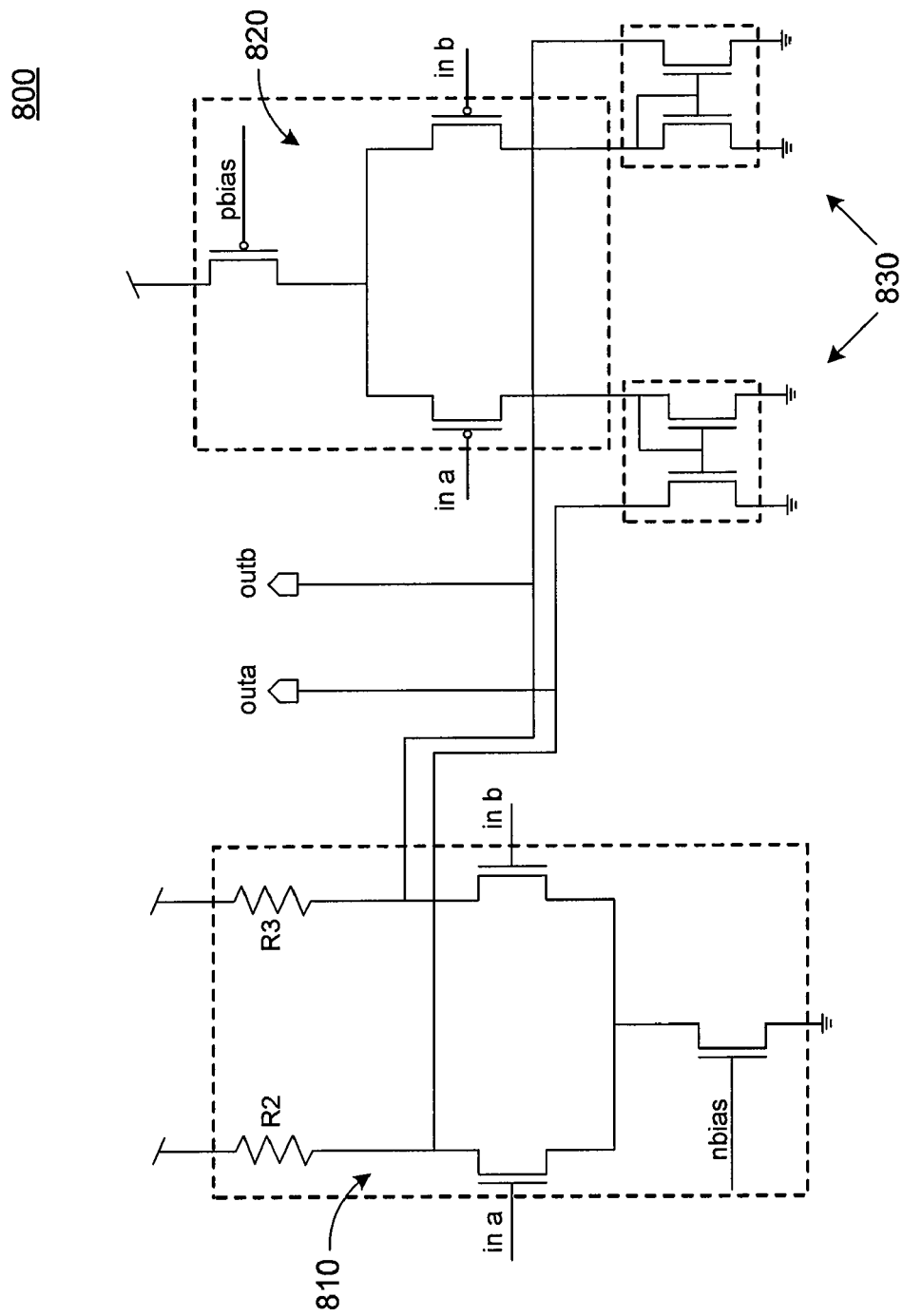
FIG. 8 is a schematic diagram of a differential amplifier according to an embodiment of the invention.

FIG. 8 illustrates a differential amplifier 800 according to an embodiment of the invention. In some embodiments, the differential amplifier 110 (FIG. 1) can be implemented as the differential amplifier 800. The differential amplifier 800 includes an n-channel differential amplifier stage 810 and a p-channel differential amplifier stage 820 coupled to the n-channel differential amplifier stage 810 through a current source having current mirror circuits 830. The differential amplifier 800 generates output signals outa, outb in response to differential input signals ina, inb. In some embodiments, the differential amplifier 800 is used as an input signal buffer.

Nbias and pbias signals may be provided to the n-channel and p-channel differential amplifier stages 810, 820, respectively, to control the current output from each of the stages through respective voltage controlled current sources. In embodiments of the invention where the differential amplifier 800 is provided with bias signals that adjust in accordance with a common mode input level, for example, bias signals from the bias circuits previously discussed, or alternative embodiments of the present invention, the total current output from the differential amplifier 800 may be constant throughout the common mode input range.

For example, in embodiments where the nbias and pbias signals are provided by a bias circuit, such as bias circuit 200 previously described with reference to FIG. 2, the nbias and pbias signals adjust over a range of common mode inputs so that in the middle region of the common mode input range both the n-channel and p-channel stages 810, 820 provide nearly equal current to the outa, outb signals. In the lower part of the range the p-channel stage 820 provides more current relative to the n-channel stage 810, and in the upper part of the range the n-channel stage 810 provides more current relative to the p-channel stage 820. In particular, as previously discussed, for a relatively low common mode input, the pbias and nbias signals are decreased in magnitude so that the current to the load circuit 250 from the current source 210 (FIG. 2) is increased and current from the current source 220 is decreased, thus offsetting each other to provide a relatively constant total current to the load circuit 250. For a relatively high common mode input, the pbias and nbias signals are increased in magnitude so that the current to the load circuit 250 from the current source 210 is decreased and the current from the current source 220 is decreased, thus offsetting each other to provide a relatively constant total current to the load circuit 250. As a result, the current to the load circuit 250 remains constant over the range of common mode inputs.

Figure 9:
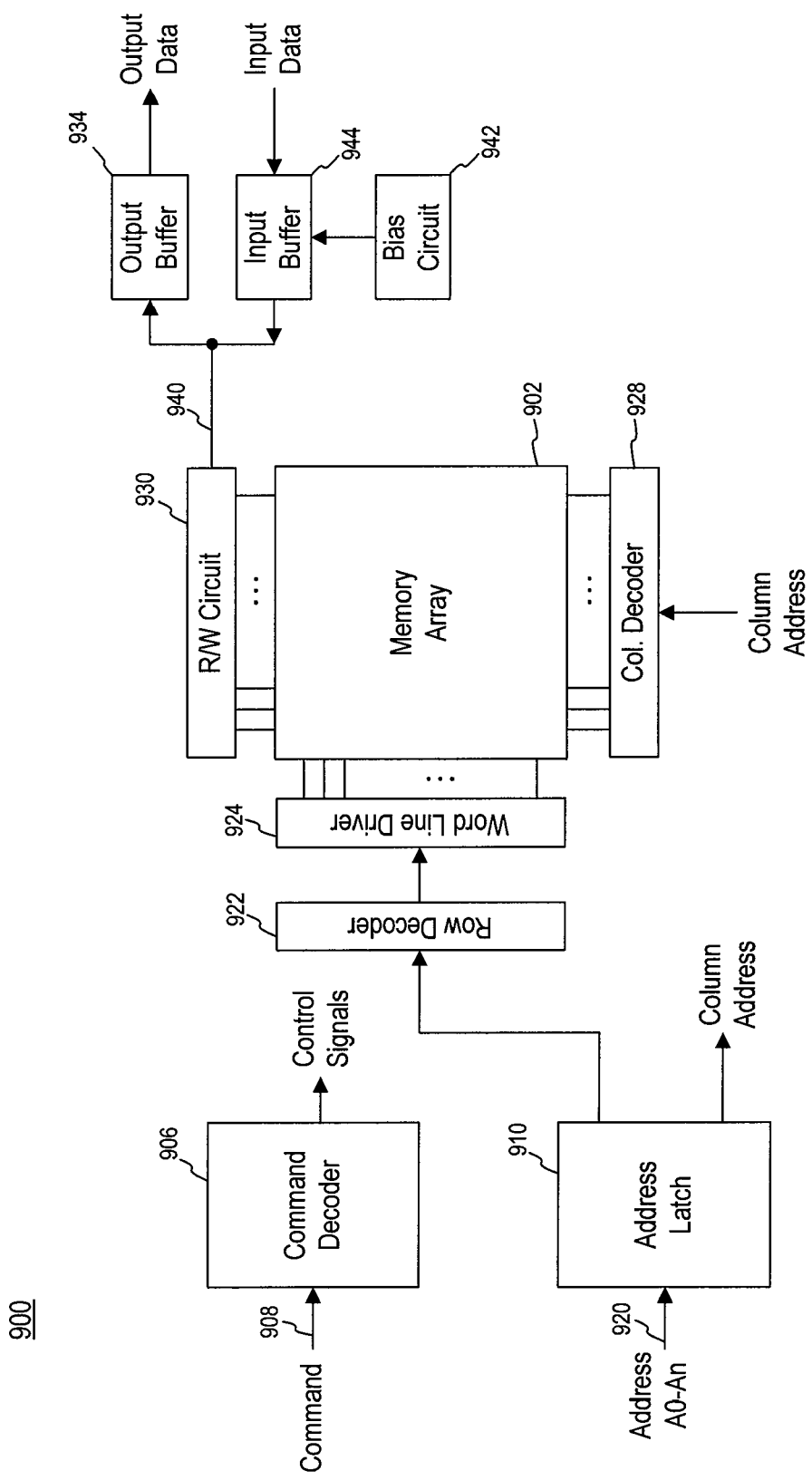
FIG. 9 is a block diagram of a memory according to an embodiment of the invention.

FIG. 9 illustrates a portion of a memory 900 according to an embodiment of the present invention. The memory 900 includes an array 902 of memory cells, which may be, for example, DRAM memory cells, SRAM memory cells, flash memory cells, or some other types of memory cells. The memory 900 includes a command decoder 906 that receives memory commands through a command bus 908 and generates corresponding control signals within the memory 400 to carry out various memory operations. Row and column address signals are applied to the memory 900 through an address bus 920 and provided to an address latch 910. The address latch then outputs a separate column address and a separate row address.

The row and column addresses are provided by the address latch 910 to a row address decoder 922 and a column address decoder 928, respectively. The column address decoder 928 selects bit lines extending through the array 902 corresponding to respective column addresses. The row address decoder 922 is connected to word line driver 924 that activates respective rows of memory cells in the array 902 corresponding to received row addresses. The selected data line (e.g., a bit line or bit lines) corresponding to a received column address are coupled to a read/write circuitry 930 to provide read data to a data output buffer 934 via an input-output data bus 940. Write data are applied to the memory array 902 through a data input buffer 944 and the memory array read/write circuitry 930. A bias circuit 942 provides the data input buffer 944 with a bias signal that adjusts over a common mode input range so that the current output by the data input buffer 944 when driving an output signal remains constant over the common mode input range. The input and output data signals shown in FIG. 9 for the data output buffer 934 and data input buffer 944 can represent single data input signals as well as complementary (i.e., differential) input signals as well. The command decoder 906 responds to memory commands applied to the command bus 908 to perform various operations on the memory array 902. In particular, the command decoder 906 is used to generate internal control signals to read data from and write data to the memory array 902.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An amplifier circuit, comprising:
 a bias circuit having a reference node and an adjustable current source coupled to the reference node, the bias circuit configured to generate a bias signal having a voltage magnitude according to a reference signal applied to the reference node, the reference signal indicative of a common mode input level of an input signal of the amplifier circuit and the bias circuit further configured to adjust the bias signal over a range of common mode input levels; and
 an amplifier having an input and an output, and a bias node, the amplifier coupled to the bias circuit and configured to generate an output signal at the output in response to the input signal at the input, the amplifier driving an output current based on the voltage magnitude of the bias signal provided by the bias circuit to the bias node of the amplifier.

2. The amplifier circuit of claim 1 wherein the amplifier comprises a differential amplifier.

3. The amplifier circuit of claim 1 wherein the amplifier comprises:
 an n-channel stage having a differential pair of n-channel transistors;
 a p-channel stage having a differential pair of p-channel transistors; and
 a current source coupled to the n-channel and p-channel stages, the current source having first and second current mirrors, the first current mirror coupled to a first one of the pair of re-channel transistors and a first one of the pair of p-channel transistors, the second current mirror coupled to a second one of the pair of n-channel transistors and a second one of the pair of p-channel transistors.

4. The amplifier circuit of claim 1 wherein the amplifier drives a substantially constant output current throughout the common mode input range.

5. The amplifier circuit of claim 1 wherein the bias signal comprises first and second bias signals.

6. The amplifier circuit of claim 5 wherein the bias circuit comprises:
 a load circuit configured to have an electrical load;
 a first adjustable current source coupled to the load circuit and configured to adjust a first current to the load circuit in response to the reference signal and the first bias signal;

a second adjustable current source coupled to the load circuit and configured to adjust a second current to the load circuit in response to the reference signal and the second bias signal; and a control circuit coupled to the load circuit and the first and second adjustable current sources, the control circuit configured to generate the first bias signal and the second bias signal to provide a constant total current from the first and second current sources to the load circuit in response to the reference signal.

7. The amplifier circuit of claim 6 wherein the control circuit comprises:

series coupled p-channel and n-channel transistors;

a first comparator circuit coupled to the load circuit and the p-channel transistor, the first comparator circuit configured to receive a first reference voltage that sets an output swing voltage of the amplifier and further configured to generate the first bias signal according to a comparison of the first reference voltage and a voltage at a node to which the first and second adjustable current sources are coupled to the load circuit, the first bias signal provided to the first adjustable current source and the p-channel transistor; and a second comparator circuit coupled to the p-channel and n-channel transistors, the second comparator circuit configured to receive a second reference voltage that indicates a voltage level at which both the p-channel and n-channel transistors are saturated, and further configured to generate the second bias signal according to a comparison of the second reference voltage and a voltage of a node between the series coupled transistors.

8. The amplifier circuit of claim 7 wherein the first and second comparator circuits comprise operational amplifiers.

9. The amplifier circuit of claim 6 wherein the control circuit comprises:

a first comparator circuit coupled to the load circuit and configured to receive a first reference voltage that sets an output swing voltage of the amplifier and further configured to generate an op-amp bias voltage according to a comparison of the first reference voltage and a voltage at a node to which the first and second adjustable current sources are coupled to the load circuit;

an op-amp coupled to the first comparator circuit to receive the op-amp bias voltage and configured to receive op-amp input signals, the op-amp configured to generate a first and second op-amp output signals having respective voltages in accordance with the op-amp bias voltage and the op-amp input signals, the first op-amp output signal provided to the amplifier as the first bias signal; and a bias generation circuit coupled to receive the second op-amp output signal, the bias generation circuit configured to generate the second bias signal for the amplifier in accordance with the voltage of the second op-amp output signal.

10. The amplifier circuit of claim 9 wherein the first and second op-amp input signals comprise a reference signal indicative of a transistor saturation voltage.

11. The amplifier circuit of claim 9, further comprising:

a first model load circuit configured to have one-half the electrical load of the load circuit;

a third adjustable current source coupled to the first model load circuit and configured to adjust a third current to the first model load circuit in response to the reference signal and a first saturation reference voltage, the voltage of the first saturation reference voltage unvarying with changes to the common input level, the voltage at a node to which the third adjustable current source is coupled to the first model load circuit provided as the first op-amp input signal;

a second model load circuit configured to have one-half the electrical load of the load circuit; and a fourth adjustable current source coupled to the second model load circuit and configured to adjust a fourth current to the second model load circuit in response to the reference signal and a second saturation reference voltage, the voltage of the second saturation reference voltage unvarying with changes to the common input level, the voltage at a node to which the fourth adjustable current source is coupled to the first model load circuit provided as the second op-amp input signal.

12. The amplifier circuit of claim 11, further comprising:

a third model load circuit configured to have an electrical load equal to the load circuit;

a fifth adjustable current source coupled to the third model load circuit and configured to adjust a fifth current to the load circuit according to a first current source control signal;

a sixth adjustable current source coupled to the third model load circuit and configured to adjust a sixth current to the load circuit in response to a second current source control signal;

a second comparator circuit coupled to the third model load circuit and configured to receive a first reference voltage that sets an output swing voltage of the amplifier and further configured to generate a second op-amp bias voltage according to a comparison of the first reference voltage and a voltage at a node to which the fifth and sixth adjustable current sources are coupled to the third model load circuit;

an op-amp coupled to the second comparator circuit to receive the second op-amp bias voltage and configured to receive a third saturation reference signal, the op-amp configured to generate third and fourth op-amp output signals having respective voltages in accordance with the second op-amp bias voltage and the third saturation reference signal, the third op-amp output signal provided to the third adjustable current source as the first saturation reference voltage; and a second bias generation circuit coupled to receive the fourth op-amp output signal, the second bias generation circuit configured to generate the second saturation reference voltage for the fourth adjustable current source in accordance with the voltage of the fourth op-amp output signal.

13. The amplifier circuit of claim 6 wherein the first adjustable current source comprises:

series coupled first and second p-channel transistors, the first p-channel transistor coupled to receive the first bias signal and the second p-channel transistor coupled to receive the reference signal; and a current mirror coupled to the series coupled p-channel transistors and the load circuit and configured to mirror current to the load circuit according to current through the series coupled transistors.

14. The amplifier circuit of claim 6 wherein the second adjustable current source comprises:

first and second series coupled n-channel transistors, the first n-channel transistor controlled by the reference signal and the second n-channel transistor controlled by the second control signal.

15. An amplifier circuit, comprising:

a bias circuit configured to generate a bias signal, the bias circuit having a load circuit and a plurality of current sources coupled to the load circuit, the bias circuit configured to adjust the current provided by at least one of the current sources to offset a change in the current provided by another one of the current sources in response to a reference signal indicative of a common mode input level to maintain a constant total current to the load circuit over a range of common mode inputs; and a differential amplifier having first and second amplifier stages and coupled to the bias circuit to receive the bias signal to set a current output for at least one of the amplifier stages.

16. The amplifier circuit of claim 15 wherein the bias circuit further includes a control circuit configured to generate first and second bias signals to control first and second current sources, respectively, the first and second current sources controlled to compensate one another when the magnitude of current is changed and provide a constant current to the load circuit.

17. The amplifier circuit of claim 15 wherein the bias circuit further includes a control circuit configured to control first and second current sources to increase current to the load circuit from one of the current sources in response to a decrease in current from the other current source.

18. The amplifier circuit of claim 15 wherein the bias signal comprises first and second bias voltages, each bias voltage provided to a respective one of the amplifier stages of the differential amplifier.

19. The amplifier circuit of claim 18 wherein the first and second amplifier stages of the differential amplifier each include a voltage controlled current source controlled by a respective bias voltage.

20. The amplifier circuit of claim 15 wherein the load circuit comprises a resistor.

21. The amplifier circuit of claim 15 wherein the differential amplifier comprises an input data buffer.

22. A method for generating a bias signal for a differential amplifier, comprising:

setting at least one of a plurality of currents to a load circuit in accordance with a control voltage to offset a change in another one of the plurality of currents to the load circuit, the change in the another one of the plurality of currents to the load circuit in response to a reference voltage indicative of a common mode input level; and providing the control voltage to the differential amplifier as the bias signal.

23. The method of claim 22 wherein setting at least one of a plurality of currents to a load circuit in accordance with a control voltage comprises:

increasing current to the load circuit from a first current source in response to decreasing current to the load circuit from a second current source; and decreasing current to the load circuit from the first current source in response to increasing current to the load circuit from the second current source.

24. The method of claim 22 wherein setting at least one of a plurality of currents to a load circuit in accordance with the control voltage comprises:

generating first and second control signals to control a respective current source coupled to the load circuit, both the first and second control signals increase in voltage in response to a change in the reference voltage in a first direction and the first and second control signals decrease in voltage in response to a change in the reference voltage in a second direction opposite of the first direction.

25. The method of claim 22 wherein setting at least one of a plurality of currents to a load circuit in accordance with a control voltage comprises:

providing equal current from first and second current sources coupled to the load circuit in response to the reference voltage having a first magnitude;

providing more current from the first current source than the current from the second current source in response to the reference voltage having a second magnitude less than the first magnitude; and providing more current from the second current source than the current from the first current source in response to the reference voltage having a third magnitude greater than the first magnitude.

26. The method of claim 22 wherein the control voltage comprises a first control voltage and a second control voltage and wherein setting at least one of a plurality of currents to a load circuit in accordance with the control voltage comprises comparing a voltage of the load circuit to a swing reference voltage, the swing reference voltage indicative of a voltage swing of an output signal from the differential amplifier;

generating the first control voltage in response to the comparison of the voltage of the load circuit to a swing reference voltage;

applying the first control voltage to a transistor to generate a second reference voltage;

comparing the second reference voltage to a saturation reference voltage, the saturation reference voltage indicative of a voltage for first and second current sources to provide equal current to the load circuit; and generating the second control voltage in response to the comparison of the second reference voltage to a saturation reference voltage.

27. The method of claim 22 wherein providing the control voltage to the differential amplifier as the bias signal comprises:

providing first and second control voltages to a differential amplifier to control current output by respective amplifier stages of the differential amplifier.

* * * * *

UNITED STATES PATENT AND TRADEMARK OFFICE
CERTIFICATE OF CORRECTION

| | | |
|---|---|---|
| PATENT NO. | : 7,944,300 B2 | Page 1 of 1 |
| APPLICATION NO. | : 12/547338 | |
| DATED | : May 17, 2011 | |
| INVENTOR(S) | : Ryan Jurasek et al. | |

It is certified that error appears in the above-identified patent and that said Letters Patent is hereby corrected as shown below:

In column 8, line 52, in Claim 3, delete "re-channel" and insert -- n-channel --, therefor.

Signed and Sealed this
Fifth Day of July, 2011

David J. Kappos
*Director of the United States Patent and Trademark Office*